(12) United States Patent
Gotsick et al.

(10) Patent No.: US 7,055,429 B2
(45) Date of Patent: Jun. 6, 2006

(54) EDGE CURE PREVENTION PROCESS

(76) Inventors: Timothy Gotsick, 1681 Kenbrook Trace, Acworth, GA (US) 30101; David Recchia, 2166 Goodwood Blvd., Smyrna, GA (US) 30080

( * ) Notice: Subject to any disclaimer, the term of this patent is extended or adjusted under 35 U.S.C. 154(b) by 104 days.

(21) Appl. No.: 10/830,560

(22) Filed: Apr. 23, 2004

(65) Prior Publication Data

US 2005/0235853 A1    Oct. 27, 2005

(51) Int. Cl.
*B41N 3/00* (2006.01)
*G03F 1/00* (2006.01)

(52) U.S. Cl. .................. 101/401.1; 430/306; 430/325; 430/326; 101/401.3; 101/395

(58) Field of Classification Search ............. 101/401.1; 430/306
See application file for complete search history.

(56) References Cited

U.S. PATENT DOCUMENTS

| | | | |
|---|---|---|---|
| 3,265,765 A | 8/1966 | Holden et al. | |
| 3,867,153 A | 2/1975 | MacLachlan | |
| 4,264,705 A | 4/1981 | Allen | |
| 4,320,188 A | 3/1982 | Heinz et al. | |
| 4,323,636 A | 4/1982 | Chen | |
| 4,323,637 A | 4/1982 | Chen et al. | |
| 4,369,246 A | 1/1983 | Chen et al. | |
| 4,423,135 A | 12/1983 | Chen et al. | |
| 4,427,759 A | 1/1984 | Gruetzmacher et al. | |
| 4,622,088 A | 11/1986 | Min | |
| 4,828,641 A | 5/1989 | Werther et al. | |
| 4,939,992 A | 7/1990 | Bird | |
| 5,135,827 A | 8/1992 | Bohm et al. | |
| 5,223,375 A | 6/1993 | Berrier et al. | |
| 5,262,275 A | 11/1993 | Fan | |
| 5,925,500 A | 7/1999 | Yang et al. | |
| 6,030,749 A | 2/2000 | Takahashi | |
| 6,180,325 B1 * | 1/2001 | Gelbart | 430/397 |
| 6,238,837 B1 | 5/2001 | Fan | |
| 6,326,124 B1 | 12/2001 | Alince et al. | |
| 6,511,784 B1 | 1/2003 | Hiller et al. | |
| 6,619,200 B1 | 9/2003 | Cacchi | |
| 2003/0075257 A1 * | 4/2003 | Salvestro | 156/64 |
| 2004/0067443 A1 | 4/2004 | Salvestro | |

FOREIGN PATENT DOCUMENTS

| | | |
|---|---|---|
| CA | 2359259 A1 * | 4/2003 |
| EP | 0 456 336 B1 | 6/1997 |
| EP | 0 640 878 B1 | 2/2003 |
| GB | 1 366 769 | 9/1974 |

* cited by examiner

*Primary Examiner*—Drew H. Hirshfeld
*Assistant Examiner*—Joshua Zimmerman
(74) *Attorney, Agent, or Firm*—Carmody & Torrance LLP

(57) ABSTRACT

An inkjet printer is used to apply an ink that is substantially opaque to actinic radiation in at least one wavelength region effective to cure the photosensitive printing plate to the edges and corners, of a printing plate after the plate has been trimmed (i.e., cut) to a suitable size and shape for mounting on a printing sleeve or cylinder. Use of inkjet printing allows for the cut surfaces of the plate to quickly and accurately be coated with a UV-opaque ink and prevents, or substantially eliminates, undesirable curing of cut surfaces of a photosensitive printing plate. The ink covers the photocurable surfaces exposed by the cutting process and prevents the cut surfaces of the printing plate from undesirably curing until proper exposure and development of the printing plate.

15 Claims, No Drawings

EDGE CURE PREVENTION PROCESS

FIELD OF THE INVENTION

The present invention relates to improved methods of preventing undesirable curing of cut surfaces of a photosensitive relief image printing plate.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical flexographic printing plate as delivered by its manufacturer is a multilayered article made of, in order, a backing, or support layer; one or more unexposed photocurable layers; a protective layer or slip film; and a cover sheet.

The backing layer lends support to the plate, and is typically a plastic film or sheet, which may be transparent or opaque. For some applications the backing layer can also be a metal such as aluminum or steel.

The photocurable layer(s) can include any of the known photopolymers, monomers, initiators, reactive or non-reactive diluents, fillers, and dyes. The term "photocurable" refers to a solid composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzrnacher, et al., U.S. Pat. No. 4,622,088 to Min, and U.S. Pat. No. 5,135,827 to Bohm, et al., the subject matter of each of which is herein incorporated by reference in its entirety. If a second photocurable layer is used, i.e., an overcoat layer, it typically is disposed upon the first layer and is similar in composition.

The photocurable materials generally cross-link (cure) and harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even more preferably from about 320 nm to about 380 nm. One suitable source of actinic radiation is a UV lamp, although other sources are generally known to those skilled in the art.

The slip film is a thin sheet, which protects the photopolymer from dust and increases its ease of handling. In a conventional plate making process, the slip film is transparent to UV light. In this process, the printer peels the cover sheet off the printing plate blank, and places a negative on top of the slip film. The plate and negative are then subjected to flood-exposure by UV light through the negative. The areas exposed to the light cure, or harden, and the unexposed areas are removed (developed) to create the relief image on the printing plate.

In "digital" plate making processes, a laser is guided by an image stored in an electronic data file, and is used to create an in situ negative on a digital (i.e., laser ablatable) masking layer, which is generally a modified slip film. Portions of the laser ablatable layer are ablated by exposing the masking layer to laser radiation at a selected wavelength and power of the laser.

The laser ablatable layer can be any photoablative masking layer known in the art. Examples of such laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety. The laser ablatable layer generally comprises a radiation absorbing compound and a binder. The radiation absorbing compound is chosen to be sensitive to the wavelength of the laser and is generally selected from dark inorganic pigments, carbon black, and graphite. The binder is generally selected from polyamides, and cellulosic binders, such as hydroxypropyl cellulose. The benefit of using a laser to create the image is that the printer need not rely on the use of negatives and all their supporting equipment, and can rely instead on a scanned and stored image, which can be readily altered for different purposes, thus adding to the printer's convenience and flexibility.

After imaging, the photosensitive printing element is developed to remove the masking layer and the unpolymerized portions of the layer of photocurable material to create a relief image on the surface of the photosensitive printing element. Typical methods of development include washing with various solvents or water, often with a brush. Other possibilities for development include the use of an air knife or heat plus a blotter.

Printing plates with laser ablatable masks can be used to form imaging elements. The flat sheet elements are cut to size and wrapped around a cylindrical form, usually a printing sleeve or the printing cylinder itself, and the edges are fused together or precisely aligned to form a printing element. However, if care is not taken to cover the photocurable surfaces exposed by the cutting process with a material that is opaque to the UV radiation used to expose the plate, a phenomenon called "edge cure" can result.

Edge cure is caused by UV light contacting the cut edges and corners of the plate, which polymerizes the photopolymer and creates an undesirable raised border around the edges of the plate. This border must then be manually cut from the plate, which requires time and can result in damage to the plate, especially if portions of the images are near the plate edge. In addition, removal of the raised border may also leave an undesirable residue on the plate, which must also be removed.

One current process used to prevent edge curing uses a felt tip pen that contains a UV-opaque ink as a means of sealing the edges of such plates. However, this is a slow, tedious process that is only about 90 percent effective at preventing edge curing of the plate.

Another process is described in U.S. Pat. No. 6,326,124 to Alince et al., the subject matter of which is herein incorporated by reference in its entirety. Alince et al. discloses an edge-covering material containing at least one soluble, film-forming polymer, at least one UV absorber, and a solvent or solvent mixture that is applied on the edges of a photocurable printing plate before imagewise exposure of the printing plate to prevent unwanted ridges that result from exposure of printing plate edges. The edge-covering material is applied by brushing or spraying. However, this method is also labor intensive and can be imprecise as the edge-covering material is manually applied to the cut edges.

Thus, there remains a need in the art for improved methods of treating cut surfaces (i.e., edges and corners) of printing plates to prevent the formation of unwanted ridges on the edges of the plate and for a method that can be performed more quickly and accurately than processes described in the prior art.

The inventors have surprisingly discovered that edge curing can be substantially eliminated by using an inkjet print head to print a UV-opaque coating onto the edges of a printing plate after the printing plate has been cut to the desired size and shape. Use of inkjet printing allows for the cut surfaces of the plate to quickly and accurately be coated with a UV-opaque ink. The improved process of the invention is automated and is thus faster, more precise, and more effective than the comparable manual processes of the prior art.

SUMMARY OF THE INVENTION

The inventors have surprisingly discovered that an inkjet printer can be used to apply an ink that is substantially opaque to actinic radiation in at least one wavelength region effective to cure the photosensitive printing plate to the cut surfaces, including edges and corners, of a printing plate after the plate has been trimmed (i.e., cut) to a suitable size and shape for mounting on a printing sleeve or cylinder. Preferably, the ink is a UV-opaque ink. Use of inkjet printing allows for the cut surfaces of the plate to quickly and accurately be coated with the UV-opaque ink.

In a first embodiment of the invention, the inkjet print head is mounted on a computer-controlled cutting apparatus, and the same software that controls the cutting knife can be used to retrace the same pattern and precisely "print" the UV-opaque ink over the freshly cut edges and corners of the printing plate.

In another embodiment of the invention, the ink is applied to the cut surfaces of the photosensitive printing plate after the photosensitive printing plate is mounted on the sleeve or cylindrical carrier.

In a third embodiment of the invention, the ink is applied to the cut surfaces of printing plate before the printing plate is imaged. In an alternate embodiment, the ink is applied to the cut surfaces of the printing plate after the printing plate is imaged but before the plate is exposed to actinic radiation.

DETAILED DESCRIPTION OF THE PREFERRED EMBODIMENTS OF THE INVENTION

The novel process of the invention prevents, or substantially eliminates, undesirable curing of cut surfaces of a photosensitive printing plate. The photosensitive printing element generally comprises a support layer, one or more layers of a photocurable material deposited on the support layer, and preferably at least one ablation layer deposited on the one or more layers of photocurable material, wherein the at least one ablation layer is ablatable by a laser at a selected wavelength and power, and wherein the ablation layer comprises a radiation absorbing material that is sensitive to radiation at the selected wavelength and power of the laser.

The photosensitive printing element is cut to a desired size and shape for mounting on a sleeve or cylindrical carrier, and an inkjet printer is used to apply an ink to the cut surfaces of the printing plate. The ink is chosen to be substantially opaque to actinic radiation in at least one wavelength region effective to cure said photosensitive printing plate. The ink covers the photocurable surfaces exposed by the cutting process and prevents the cut surfaces of the printing plate from curing during subsequent exposure and development of the printing plate. After the printing plate has been cut to the desired size and shape, the photosensitive printing plate is mounted on the sleeve or cylindrical carrier.

In a first embodiment of the invention, the inkjet print head is mounted on a computer-controlled cutting apparatus, and the same program that is used to cut the printing plates to the desired size and shape for mounting on a sleeve or cylindrical carrier, can be used to print a UV-opaque coating onto the edges and corners of the plate immediately after cutting.

Computer controlled cutting-tables are often used in plate making processes for the intricate cutting that is necessary to prepare photopolymer plates for mounting on sleeves and cylindrical carriers and to precisely and reproducibly cut flat photopolymer sheets into a desired shape. The same software that controls the cutting knife can be used to retrace the same pattern and precisely "print" the UV-opaque ink over the freshly cut edges and corners of the printing plate and thus prevent edge curing during subsequent exposure. The plates can then be processed in the usual manner.

In another embodiment of the invention, the ink is applied to the cut surfaces of the photosensitive printing plate after the photosensitive printing plate is mounted on the sleeve or cylindrical carrier. Performing the edge cure prevention treatment at this point in the process reduces the likelihood that the UV opaque coating will be compromised during the handling required to mount the flat plate to a round sleeve or carrier. Furthermore, if the edge cure prevention treatment is performed after imaging of the plate, accidental damage that may occur during transfer of the plate to the processing machine for removal of uncured photopolymer is also prevented.

The UV-opaque inks that are usable in the instant invention include any liquid or solid moiety that is both substantially opaque to actinic radiation in at least one wavelength region effective to cure the above-described photocurable elements and substantially resistant to polymerization upon exposure to actinic radiation in that wavelength region. Substantially opaque inks are those that can absorb at least about 85% of any incident actinic radiation, preferably about 90% of such radiation, more preferably about 95%, and even more preferably 99.9% of such radiation. It will be recognized that a substantially opaque ink need not be substantially opaque in all amounts and at all possible concentrations, so long as it can be deposited upon a substrate in sufficient quantity so as to be substantially opaque. Preferred inks include one or more radiation-absorptive molecules dissolved in solvent, preferably at concentrations of about 3 to about 20 weight percent. Particularly preferred inks are the U-26, U-53M, Black 4D, and Jolt brands (Dataproducts Corporation) and those formed by mixing Crown Super Marking Stamping Ink (Fulton Marking Equipment Company, Warminster, Pa.) and UVINUL 3050 brand 2,2',4,4'-tetrahydroxybenzophenone (BASF, Ludwigshaven, Germany) in a solvent selected from methanol, isopropanol, n-butanol, chloroform, methyl ethyl ketone, propylene glycol monomethyl ether, dipropylene glycol monomethyl ether, diethylene glycol ethyl ether, and mixtures thereof. Other useful ink ingredients include the Tinopal SPF and Joncryl 68 products, which are commercially available from Ciba-Geigy Corp., Hawthorn, N.Y., and S.C. Johnson Company, Milwaukee, Wis., respectively.

A suitable inkjet printing apparatus is the Displaymaker 72-S, which is available from MacDermid Colorspan, Inc. of Minneapolis, Minn. Preferably, the inkjet printer is controlled by a microprocessor, so that the ink may be precisely applied to the cut surfaces of the photosensitive printing plate. In one embodiment of the invention, the same microprocessor that is used to control the cutting apparatus is used to control the inkjet printer so that the ink can trace the same pattern as the cutting blades and thus precisely cover the cut surfaces of the printing plate.

In another embodiment of the invention, the ink is applied to the cut surfaces of printing plate before the printing plate is imaged. In an alternate embodiment, the ink is applied to the cut surfaces of the printing plate after the printing plate is imaged but before the areas of the one or more photocurable layers which were not exposed to actinic radiation are removed from the surface of the photosensitive printing plate.

Several approaches are suggested for applying the edge cure prevention treatment and each of the approaches can achieve a comparable result. In the first approach, a device, which is separate from the sleeve processor, is used to print the UV barrier coating on the cut edges of the digital plate that is already mounted to a sleeve or carrier, either before or after laser ablation of the digital mask. In the second approach, a device that is integrated into the front end of the sleeve processor is used, wherein the device has the ability to print the UV barrier coating on the cut edges of the sleeve mounted digital plate after ablation of the digital mask, but immediately prior to exposure through the imaged mask and subsequent removal of the mask and un-crosslinked photopolymer. This approach is the preferred approach, because it eliminates most handling of the plate after the UV edge barrier coating is applied and therefore reduces or eliminates the likelihood of damage to the UV edge barrier coating.

What is claimed is:

1. A method of preventing undesirable curing of edges of a photosensitive printing plate, the method comprising the steps of:
    a) providing a photosensitive printing plate;
    b) using an inkjet printer to apply an ink to cover at least portions of the edges of the printing plate, wherein the ink is substantially opaque to actinic radiation in at least one wavelength region effective to cure the photosensitive printing plate;
   wherein the ink is applied to cover at least portions of the edges of the printing plate before the printing plate is mounted on a sleeve or cylindrical carrier.

2. The method according to claim 1, further comprising a step of mounting the photosensitive printing plate on the sleeve or cylindrical carrier.

3. The method according to claim 1, wherein the photosensitive printing plate comprises:
    a) a support layer;
    b) one or more layers of a photocurable material deposited on the support layer; and
    c) at least one ablation layer deposited on the one or more layers of photocurable material, wherein the at least one ablation layer is ablatable by a laser at a selected wavelength and power, and wherein the ablation layer comprises a radiation absorbing material that is sensitive to radiation at the selected wavelength and power of the laser.

4. The method according to claim 3, further comprising the steps of:
    selectively ablating the at least one ablation layer with the laser to provide ablated and nonablated areas thereby forming an image;
    flood exposing the laser imaged printing plate to UV light, thereby curing the one or more photocurable layers in areas under ablated areas of the ablation layer; and
    treating the flood exposed laser imaged printing plate to remove the portions of the at least one ablation layer that were not removed during the laser ablation step and the areas of the one or more photocurable layers that were not exposed to actinic radiation.

5. The method according to claim 1, wherein the ink is a UV-opaque ink.

6. The method according to claim 5, wherein the UV-opaque ink is selected from the group consisting of inks comprising carbon black and inks comprising ultraviolet radiation absorbing compounds.

7. The method according to claim 1, wherein the inkjet printer is controlled by a microprocessor and the ink is precisely applied to cover and seal the edges of the photosensitive printing plate.

8. The method according to claim 7, wherein the photosensitive printing plate is cut to the pattern of the desired size and shape by one or more cutting blades, and the inkjet printer applies the ink on the surface exposed by the one or more cutting blades immediately after cutting.

9. The method according to claim 4, wherein the ink is applied to the edges of printing plate before the printing plate is imaged.

10. A method of preventing undesirable curing of edges of a photosensitive printing plate, the method comprising the steps of:
   a) providing a photosensitive printing plate, said photosensitive printing plate comprising:
      i) a support layer;
      ii) one or more layers of a photocurable material deposited on the support layer; and
      iii) optionally, at least one ablation layer deposited on the one or more layers of photocurable material, wherein the at least one ablation layer is ablatable by a laser at a selected wavelength and power;
   b) cutting the photopolymer printing element in a pattern of a desired size and shape for mounting on a sleeve or cylindrical carrier; and
   c) using an inkjet printer to apply an ink to the cut surfaces of the printing plate, wherein the ink is substantially opaque to actinic radiation in at least one wavelength region effective to cure said photosensitive printing plate; and
   wherein the ink covers the photocurable surfaces exposed by the cutting process, and wherein the ink is applied to cover at least portions of the cut surfaces of the printing plate before the printing plate is mounted on a sleeve or cylindrical carrier.

11. The method according to claim 10, wherein the ink is a UV-opaque ink.

12. The method according to claim 11, wherein the UV-opaque ink is selected from the group consisting of inks comprising carbon black and inks comprising ultraviolet radiation absorbing compounds.

13. The method according to claim 10, wherein the inkjet printer is controlled by a microprocessor, wherebythe ink is precisely applied to the cut surfaces of the photosensitive printing plate.

14. The method according to claim 13, wherein the photosensitive printing plate is cut to the pattern of the desired size and shape by one or more cutting blades, and the inkjet printer applies the ink in the pattern exposed by the one or more cutting blades immediately after cutting.

15. The method according to claim 10, wherein the ink is applied to the cut surfaces of printing plate before the printing plate is imaged.

* * * * *